United States Patent [19]

Anderson

[11] 4,441,088
[45] Apr. 3, 1984

[54] STRIPLINE CABLE WITH REDUCED CROSSTALK

[75] Inventor: Carl J. Anderson, Peekskill, N.Y.

[73] Assignee: International Business Machines Corporation, Armonk, N.Y.

[21] Appl. No.: 336,205

[22] Filed: Dec. 31, 1981

[51] Int. Cl.³ .............................................. H01P 3/08
[52] U.S. Cl. ......................................... 333/1; 174/36; 174/117 FF; 174/126 S; 333/238; 333/99 S
[58] Field of Search ......... 174/35, 36, 117 F, 117 FF, 174/117 PC, 126 S; 333/1, 238, 246, 99 S

[56] References Cited

U.S. PATENT DOCUMENTS 3,179,904 4/1965 Paulsen ................................. 333/1
3,634,782 1/1972 Marshall .............................. 333/1

*Primary Examiner*—Paul L. Gensler
*Attorney, Agent, or Firm*—Carl C. Kling; Jackson E. Stanland

[57] ABSTRACT

A transmission line having substantially reduced far-end forward wave crosstalk is characterized by a single layer of dielectric material having a thickness chosen to provide a forward wave coupling constant $K_F$ substantially equal to zero. The dielectric layer is located on a ground plane, and has a plurality of signal carrying conductors embedded in it. The thickness H of the dielectric underlayer below the signal carrying conductors is chosen to provide a transmission line having the selected values of impedance, etc. and substantially reduced forward wave crosstalk. The thickness t of the dielectric overlayer above the signal carrying conductors is chosen (for the selected value of thickness H of the dielectric underlayer) at the finite value critical thickness at which forward wave mutual capacitance and forward wave mutual inductance cancel to a null. The ground plane and the signal carrying conductors can be superconductors.

5 Claims, 3 Drawing Figures

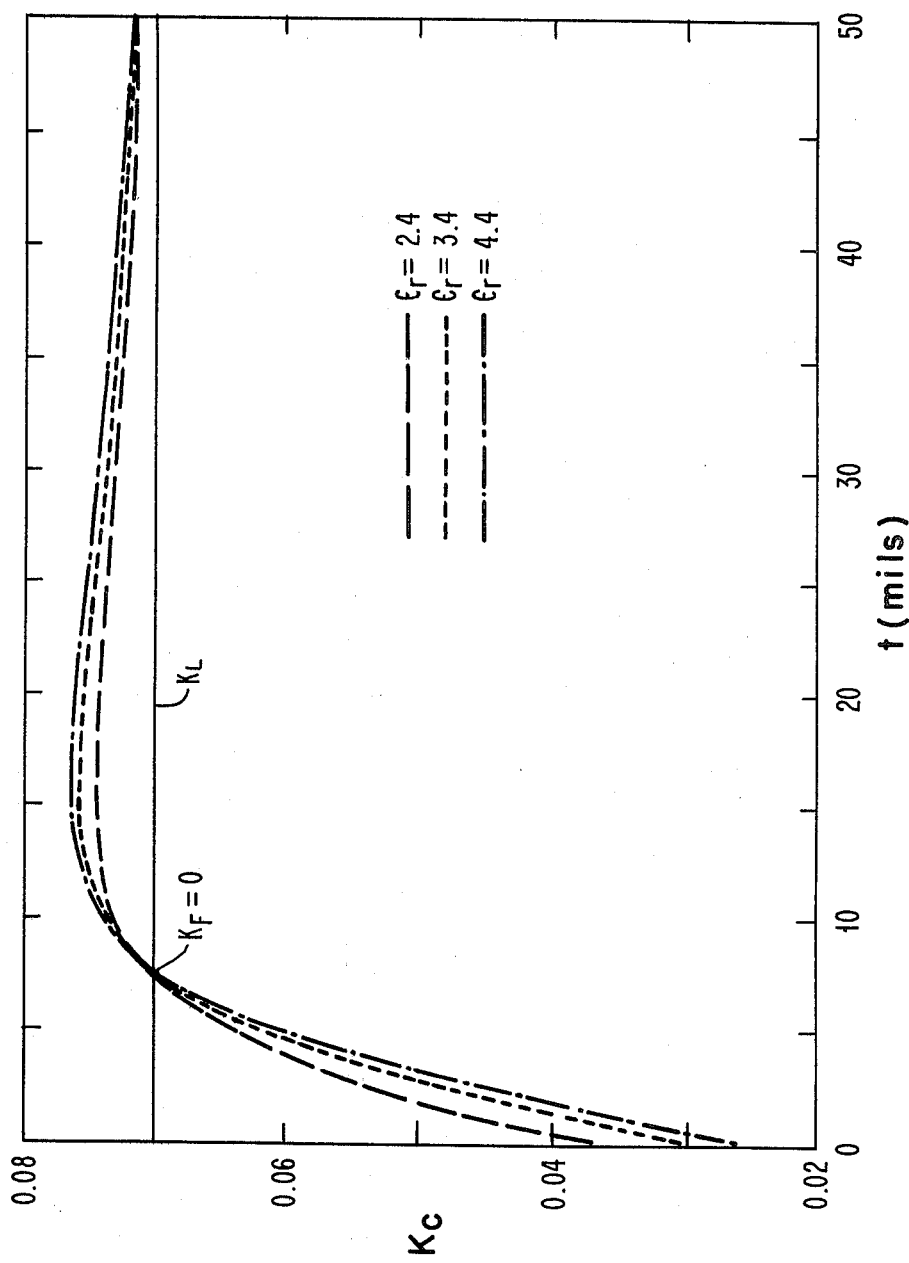

STRIPLINE CABLE WITH REDUCED CROSSTALK

DESCRIPTION

1. Field of the Invention

This invention relates to a transmission line having reduced forward wave crosstalk, and more particularly to a transmission line using a single thin dielectric overlayer of critical thickness above the signal conductors to reduce far-end forward wave crosstalk to zero by cancellation of forward wave mutual capacitance and forward wave mutual inductance.

2. Background Art

Many different forms of cables have been used to transfer high speed data from one point to another. The cable designer generally has to consider the frequencies to be transmitted, and parameters such as impedance, attenuation, and crosstalk. In particular, the elimination of crosstalk is very important, since this becomes a more serious problem with microstrip transmission lines as the pulse rise times become faster and as the density of the signal lines on the microstrip cable is increased. The problem of far-end crosstalk is particularly troublesome when flat cables are to be used.

In many data transmission networks, flat cables are desirable because they have the potential of providing high wire density and physical strength even though they are very thin. Such cables are comprised of a plurality of signal carrying conductors and a ground plane, can be readily fabricated because automated machines are available for their fabrication. However, the susceptibility to crosstalk at high switching speeds has been the major deterrent to the use of such cables.

Generally, flat cables develop high crosstalk whenever the signal propagation delay along the length of the cable approaches the rise time of the pulse that is being propagated. The propagation delay is related to the length of the transmission line and the square root of the effective dielectric constant of the insulating material used to separate the signal conductors from the ground plane.

If a signal is introduced into one of two adjacent signal lines, there will be coupling between the two lines due to the mutual inductance and capacitance between the lines. The electrostatic and electromagnetic fields that accompany the travelling signal will couple the signal into the quiet line. In turn, the induced voltage and current in the quiet line propagate in both the forward and backward directions at the same speed as the exciting signal, but with differences in the polarity of the components of the backward and forward crosstalk. The capacitively coupled component propagates in both directions with the same polarity as the signal in the exciting line, while the inductively coupled component propagates backward with the same polarity and forward with the opposite polarity. Consequently, the near-end crosstalk component is the sum of both the capacitive and inductive effects, while the far-end crosstalk component is the net difference between the inductively and capacitively coupled effects because they are opposite in polarity. Consequently, far-end forward crosstalk is zero if these components are equal.

J. G. Marshall described an improved flat cable for the transmission of signals in an article entitled "Microelectronics Interconnection and Packaging", which appeared on page 108 of Electronics Magazine Books, Copyright 1980 by McGraw-Hill, Inc. This flat cable is characterized by the use of a dual dielectric cable configuration in which the signal conductors are surrounded by a core of low dielectric constant material, that core being in turn clad by a material with higher dielectric constant.

U.S. Pat. No. 3,740,678 describes a strip transmission line in which two different materials are used as the dielectric media. The core dielectric has a higher dielectric constant than the outer dielectric layer. This line can be used to minimize crosstalk.

U.S. Pat. No. 3,634,782 describes a flat flexible tape cable which is enclosed in a metallic electric shield. The spacings between adjacent signal carrying conductors and between the conductors and the shield are related in such a way as to minimize crosstalk.

It is desirable to provide strip cables which can be made in microstrip configurations having high density signal conductors, in which forward wave crosstalk in substantially zero. Generally, the geometries of these reference cables are complex and require the use of multiple dielectrics, which is a disadvantage. Additionally, it is not easy to reduce forward wave crosstalk by a significant amount in these cables without changing the basic geometry or impedance, or without adding significant bulk to the cable.

Accordingly, it is a primary object of this invention to provide an improved strip cable in which far-end forward wave crosstalk is substantially reduced.

It is another object of this invention to provide a strip cable which can be made in a microstrip geometry with a high density of signal conductors, where the cable has substantially reduced forward wave crosstalk and can be easily fabricated.

It is another object of this invention to provide a microstrip cable having significantly reduced forward wave crosstalk, which is obtained without changing the basic microstrip geometry or impedance of the cable, and without requiring the addition of significant bulk to the cable.

It is a further object of this invention to provide a microstrip cable for transmission of high speed pulses with significantly reduced forward wave crosstalk, where the cable does not require the need for multiple dielectrics.

It is another object of this invention to provide an improved microstrip cable which can be fabricated easily with a high density of signal conductors, and which will provide substantially reduced forward wave crosstalk when high frequency pulses are transmitted in the cable.

DISCLOSURE OF THE INVENTION

This planar transmission line typically has a microstrip geometry which can be applied either to small printed circuit (pc) boards, or to flat cables. In one embodiment, a flat cable design includes a single conductor plane having a plurality of conductors embedded in a single dielectric at a height H over a ground plane. The thickness t of the overlying dielectric material over the signal lines is chosen so that, for any H, the forward wave coupling constant $K_F$ is substantially equal to zero at a small finite value of t. Typically, the individual signal lines can have a rectangular or square geometry or can be round, and the signal conductors are located in a single plane. An order of magnitude reduction in crosstalk can be achieved for a given transmission line length and pulse rise time.

These and other objects, features, and advantages will be apparent from the following more particular description of the preferred embodiments.

BRIEF DESCRIPTION OF THE DRAWINGS

FIG. 3 is a plot of the capacitive forward wave coupling coefficient $K_C$ and the inductive forward wave coupling coefficient $K_L$ as a function of the thickness t of the dielectric overlayer above the signal conductors, for different values of the relative dielectric constant $\epsilon_r$.

BEST MODE FOR CARRYING OUT THE INVENTION

Figure 1:
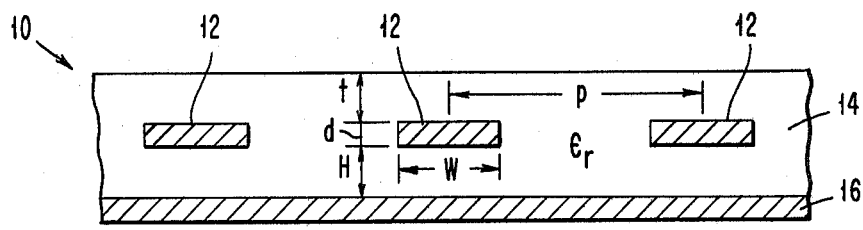
FIG. 1 is a cross-sectional view of a cable or pc board useful for high speed signal transmission with substantially reduced forward wave crosstalk.

FIG. 1 is a side view of a portion of a transmission line 10 which could be a portion of a flat cable or a pc board. Transmission line 10 is characterized by a plurality of conductors 12 embedded in a dielectric 14 having a relative dielectric constant $\epsilon_r$. Conductors 12 are located over a ground plane 16 and are separated therefrom by a distance H. In this embodiment, the conductors have a center-to-center spacing p, and are of rectangular shape, having a thickness d and a width W. The thickness of dielectric overlayer 14 over the conductors 12 is designated t.

The forward wave crosstalk in transmission line 10 is proportional to the forward wave coupling constant $K_F$, which is defined as $$K_F = (C_m/C_s) - (L_m/L_s),$$

where $C_m$ is the mutual capacitance between two neighboring signal lines, $C_s$ is the self capacitance of a signal line 12, $L_m$ is the mutual inductance between neighboring signal lines 12, and $L_s$ is the self inductance of a signal line 12.

Figure 2:
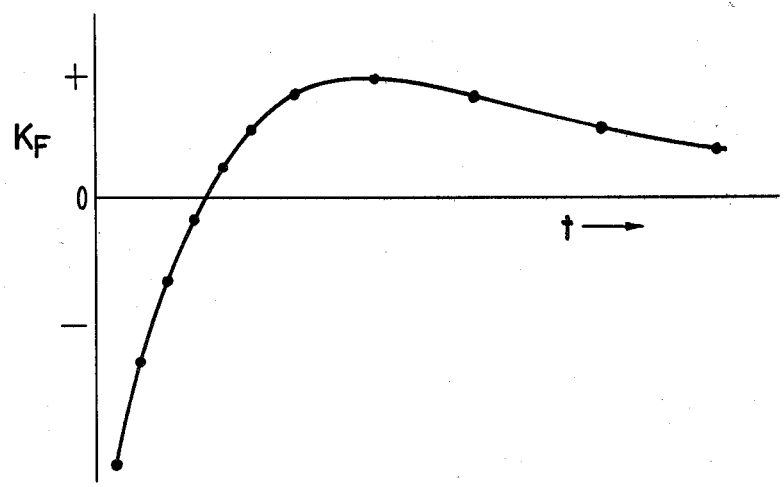
FIG. 2 is a plot of forward wave coupling coefficient $K_F$ vs. t, where t is the thickness of the dielectric above the signal conductors.

In FIG. 2, $K_F$ is plotted against t in a transmission line where H, W, p, d, and $\epsilon_r$ were kept constant. At small values of t, $K_F$ is negative and its magnitude can be quite large. As t increases, $K_F$ increases and passes through zero, reaching a positive maximum and then decreasing to zero as t approaches infinity. The important result shown in FIG. 2 is that the forward wave coupling constant $K_F$ is equal to zero at a finite small value of t, not just at $t=\infty$. Further, for any value of H, a finite thickness t can be found such that $K_F=0$. This means that microstrip cable can be made with substantially reduced forward wave crosstalk by suitably choosing a combination of H and t such that $K_F$ approaches zero. This can be easily done without changing the basic microstrip geometry or impedance, and without adding significant bulk to the cable.

The geometry of the stripline and its dielectric constant determine the mutual capacitance $C_m$ and the mutual inductance $L_m$. $C_m$ and $L_m$ cannot be made equal to one another without the dielectric thickness t above the conductors. In order to substantially reduce far-end forward wave coupling $C_m/C_s$ must be made equal to $L_m/L_s$. In the practice of this invention, the height H of the dielectric underlayer is chosen to provide certain parameters to the cable, such as impedance, physical strength, etc. For that height H, the thickness t of the dielectric overlayer is set at that amount which will make $K_F$ substantially equal to zero (i.e., $C_m/C_s = L_m/L_s$). In experimentation, it has been found that a thickness t can be obtained having a reasonable value for any thickness H in order to make $K_F=0$.

As an example, a microstrip cable having the geometry of FIG. 1 was made with $K_F=0$ with the following parameters:
W = 6 mils
H = 3.3 mils
p = 20 mils
d = 1.3 mils
$\epsilon_r = 3.1$
t = 5.4 mils FIG. 3 is a plot of the inductive forward wave coupling constant $K_L$ and the capacitive forward wave coupling constant $K_C$, as a function of the thickness of t, for three different values of relative dielectric constant $\epsilon_r$. In this plot $K_F=0$ where $K_C$ crosses $K_L$. As is apparent from FIG. 3, the value of t where $K_C=K_L$ is not a very strong function of $\epsilon_r$ although it is to be expected that, as $\epsilon_r$ increases, the crossover point of $K_C$ and $K_L$ will move toward the left in this plot.

In this invention, $K_F$ is made nominally zero for nearest conductors 12. Generally, this goal cannot be reached for two more widely separated conductors, although the cross coupling decreases as the separation between conductors increases, so the problem is less pronounced than it is for nearest neighbor conductors. In the practice of this invention, forward wave crosstalk can be substantially reduced without added fabrication difficulty—i.e., cables with a flat geometry can be made where the crosstalk induced signal in a quiet conductor is only about 2% of the signal in the adjacent, active conductor, for lines 1–2 meters in length. Of course, crosstalk varies directly with line length and inversely with the pulse rise time.

The general equations for the design of transmission lines in the form of cables or pc boards are well known in the art, as can be seen by referring to the aforementioned article by Marshall, as well as by reference to the following patents and publications:

U.S. Pat. No. 3,740,678
U.S. Pat. No. 3,634,782
H. R. Kaupp, "Pulse Crosstalk Between Microstrip Transmission Lines", Symposium Record, Seventh International Electronic Circuit Packaging Symposium, 1966.
N. C. Arvanitakis et al, "Coupled Noise Reduction In Printed Circuit Boards For A High Speed Computer System", Symposium Record, Seventh International Electronic Circuit Packaging Symposium, WESCON, 1966.
Y. M. Hill et al., IBM J. Res. Develop., pages 314–322, May 1969.

The designer selects the dielectric that he wishes to use and determines the thickness H for the size and density of the signal conductors that are to be used. Once the impedance, attenuation, and various values of mutual and self capacitance and inductance have been calculated to provide suitable transmission properties, the dielectric overlayer thickness t can be calculated or experimentally determined to have $K_F \rightarrow 0$.

What has been described is a transmission line suitable for use in flat cables and pc boards, wherein a single groundplane is separated from a plurality of signal conductors by a dielectric layer whose thicknesses above and below the conductors are controlled to provide greatly reduced far-end forward wave cross coupling.

For use in superconducting technology, the signal conductors and the ground plane can be made of superconducting materials. The dielectric is a single layer having a single dielectric constant, the materials being used in conventional dielectrics being suitable for use in the transmission line of this invention.

While the invention has been described with respect to specific embodiments thereof, it will be understood by those of skill in the art that variation in form and detail may be made without departing from the spirit and scope of the invention.

Having thus described my invention, what I claim as new, and desire to secure by Letters Patent is:

1. A transmission line for carrying high speed signals with substantially reduced forward wave crosstalk, consisting essentially of a ground plane layer comprised of a plane of electrically conductive material;

a layer of dielectric material, having a single dielectric constant $\epsilon_r$, located on said ground plane;

a plurality of signal carrying conductors located in said layer of dielectric and separated from said ground plane layer by a thickness of dielectric underlayer H, there being a thickness of said dielectric material above said plurality of conductors forming a dielectric overlayer of a thickness t, the thickness H being chosen to yield a transmission line having a desired impedance, and said thickness t of dielectric overlayer being chosen for the value of H such that the forward wave crosstalk components (mutual capacitance and mutla inductance) between adjacent signal carrying conductors are substantially equal and opposite.

2. A transmission line made up of a ground plane, a dielectric underlayer arrayed on such ground plane, a number of conductors arrayed on such dielectric underlayer in a conductor layer substantially parallel to such ground plane, and a dielectric overlayer arrayed on such conductors characterized by (a) a set of parameters, not including parameter t (thickness of the dielectric overlayer), providing mechanical stability and impedance attributes postulated for an operational objective, which set of parameters together with parameter t define a plot of forward wave coupling coefficient of crosstalk versus thickness of dielectric overlayer, which plot rises through a null at a small finite value and thereafter falls asymptotically toward a second null at infinity; and (b) the thickness of said dielectric overlayer is the thickness corresponding to such null at a small finite value.

3. The transmission line of claim 2 further characterized in that the ground plane and the conductors are superconductors.

4. The transmission line of claim 2 further characterized in that the signal carrying conductors are thin films of substantially rectangular cross section, all in the same plane, and substantially parallel.

5. A microstrip superconducting transmission line structure comprising (a) superconducting ground plane;

(b) a planar array of superconducting signal conductors arrayed substantially parallel to each other and to said superconducting ground plane;

(c) a dielectric layer arrayed on said superconducting ground plane in such fashion that said signal conductors are embedded in a planar central portion of said dielectric layer, defining by its position a dielectric underlayer and a dielectric overlayer;

whereby said ground plane, signal conductors and said dielectric underlayer together delimit mechanical strength and impedance, and have parameters of mutual capacitance and self-inductance which are components of forward wave crosstalk, which components for a postulated thickness of dielectric overlayer define a finite value null and approach at infinity an infinite value null; and (d) the thickness of said dielectric overlayer is the thickness at which said finite value null occurs.

* * * * *

UNITED STATES PATENT AND TRADEMARK OFFICE
CERTIFICATE OF CORRECTION

PATENT NO. : 4,441,088
DATED : Apr. 3, 1984
INVENTOR(S) : Carl J. Anderson

It is certified that error appears in the above-identified patent and that said Letters Patent is hereby corrected as shown below:

Column 1, line 64, "J. G. Marshall" should read --J. B. Marshall--.

Column 2, line 18, "in" (second occurrence) should read --is--.

Column 5, claim 1, line 30, "mutla" should read --mutual--.

Signed and Sealed this

Ninth Day of July 1985

[SEAL]

Attest:

DONALD J. QUIGG

Attesting Officer     Acting Commissioner of Patents and Trademarks